(12) United States Patent
Beasom

(10) Patent No.: US 6,368,920 B1
(45) Date of Patent: Apr. 9, 2002

(54) TRENCH MOS GATE DEVICE

(75) Inventor: James Douglas Beasom, Melbourne Village, FL (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/096,217

(22) Filed: Jun. 11, 1998

Related U.S. Application Data

(62) Division of application No. 08/636,904, filed on Apr. 10, 1996, now Pat. No. 5,770,878.

(51) Int. Cl.[7] .......................................... H01L 21/336
(52) U.S. Cl. ...................... 438/270; 438/287; 438/589; 438/591
(58) Field of Search ................................. 438/270, 271, 438/268, 138, 287, 589, 981, FOR 363, 591; 148/DIG. 163

(56) References Cited

U.S. PATENT DOCUMENTS

| | | | | |
|---|---|---|---|---|
| 4,546,367 A | 10/1985 | Schutten et al. | ............ | 257/331 |
| 4,589,193 A | 5/1986 | Goth et al. | ................. | 438/430 |
| 4,767,722 A | 8/1988 | Blanchard | .................. | 438/270 |
| 4,921,815 A | * 5/1990 | Miyazawa | .................. | 438/270 |
| 4,941,026 A | 7/1990 | Temple | ........................ | 257/333 |

(List continued on next page.)

FOREIGN PATENT DOCUMENTS

| | | | | |
|---|---|---|---|---|
| EP | 0 043 014 | 1/1982 | | |
| EP | 0 076 935 | 4/1983 | | |
| EP | 0 523 450 A1 | 1/1993 | | |
| JP | 5565463 | 5/1980 | ................. | 257/330 |
| JP | 405 335582 A | 12/1993 | | |
| JP | 07-245400 | * 9/1995 | | |
| WO | WO 94/17558 | 8/1994 | | |

OTHER PUBLICATIONS

European Search Report, Date Search Completed: Sep. 1, 1997. Search: Hague Application No. EP 97 10 8480.

C. Balucca and R. Rossen, "Trench DMOS Transistor Technology for High Current (100 A Range) Switching", Solid–State Electronics, vol. 34, No. 5, pp. 493–507, 1991, Great Britain.

S. Sugiyama, T. Suzuki, K. Kawahata, K. Shimaoka, M. Takigawa and I. Igarashi, "Micro–Diaphragm Pressure Sensor", IEEE, International Electron Devices Meeting, pp. 184–187, 1986.

*Primary Examiner*—Michael Trinh
(74) *Attorney, Agent, or Firm*—Jaeckle Fleischmann & Mugel, LLP

(57) ABSTRACT

The present invention is directed to an improved trench MOS gate device that comprises a trench whose floor and sidewalls include layers of dielectric material, the layers each having a controlled thickness dimension. These thickness dimensions are related by a controlled floor:sidewall layer thickness ratio, which is established by individually controlling the thickness of each of the floor and sidewall dielectric layers. This floor to sidewall layer thickness ratio is preferably at least 1 to 1, more preferably at least 1.2 to 1. Further in accordance with the present invention, a process for forming an improved trench MOS gate device comprises etching a trench in a silicon device wafer and forming layers of dielectric material on the trench floor and on the sidewalls, each layer having a controlled thickness dimension. The thickness dimensions are related by a controlled floor to sidewall layer thickness ratio that is preferably at least 1 to 1. When silicon dioxide is employed as the dielectric material, the layers preferably comprise a composite of thermally grown and deposited silicon dioxide. The trench containing the dielectric layers is filled with polysilicon, and an insulator layer is formed over the polysilicon, thereby forming a trench gate. A patterned electrically conducting metallic interconnect is formed over the trench gate.

18 Claims, 4 Drawing Sheets

U.S. PATENT DOCUMENTS

| | | | |
|---|---|---|---|
| 4,992,838 A | * 2/1991 | Mori | 257/331 |
| 5,016,068 A | 5/1991 | Mori | 257/317 |
| 5,040,034 A | 8/1991 | Murakamiet et al. | 257/330 |
| 5,196,373 A | 3/1993 | Beasom | 438/404 |
| 5,248,894 A | 9/1993 | Beasom | 257/519 |
| 5,321,289 A | * 6/1994 | Baba et al. | 257/331 |
| 5,385,853 A | 1/1995 | Mohammad | 438/270 |
| 5,410,170 A | 4/1995 | Bulucca et al. | 257/332 |
| 5,468,982 A | 11/1995 | Hshieh et al. | 257/331 |
| 5,726,088 A | * 3/1998 | Yanagiya et al. | 438/268 |

* cited by examiner

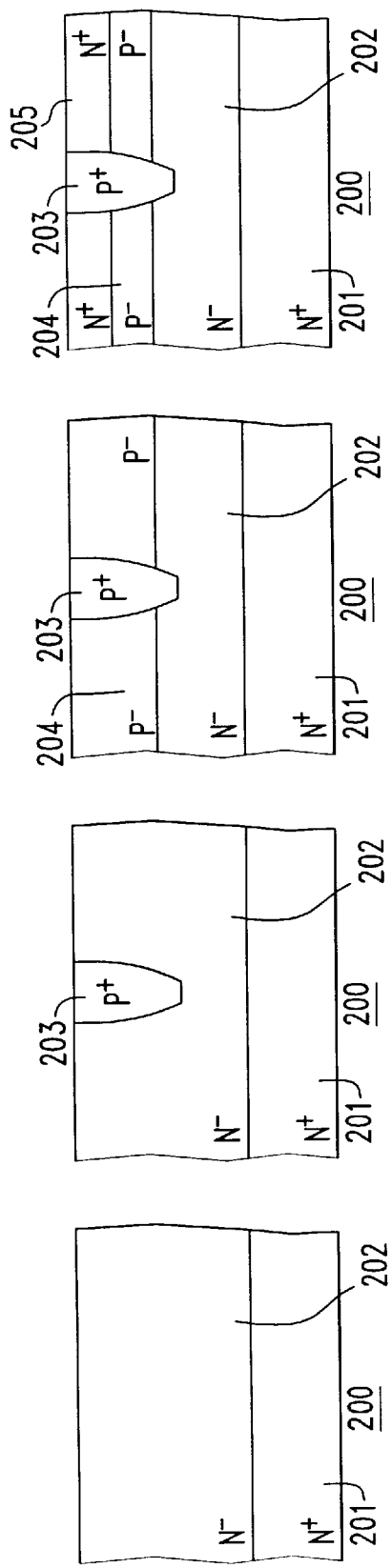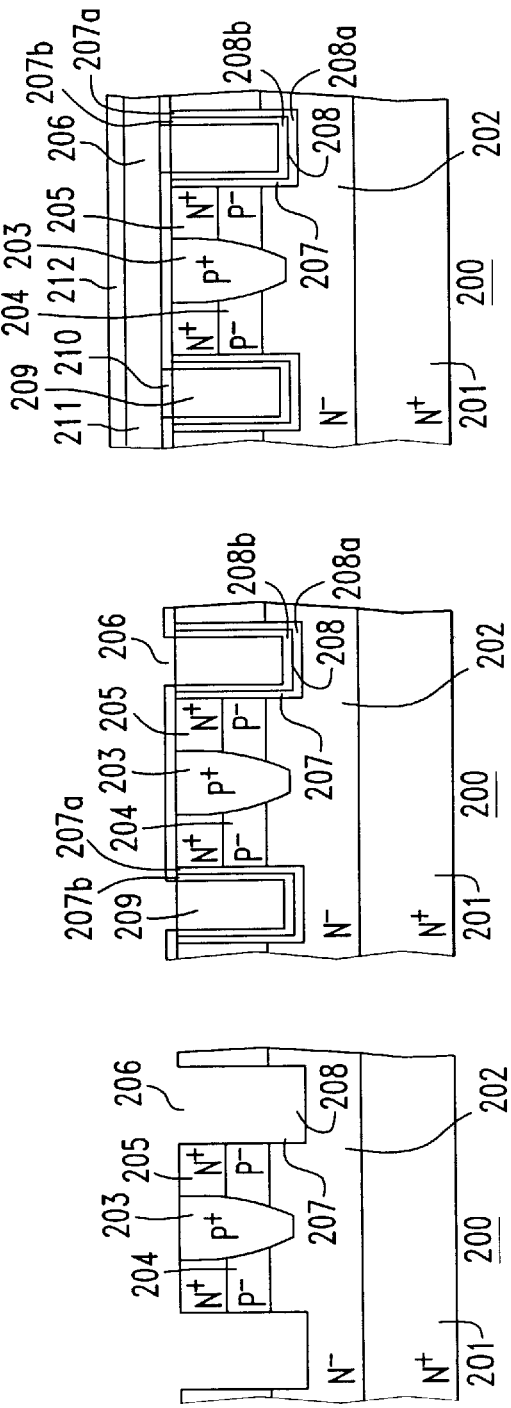

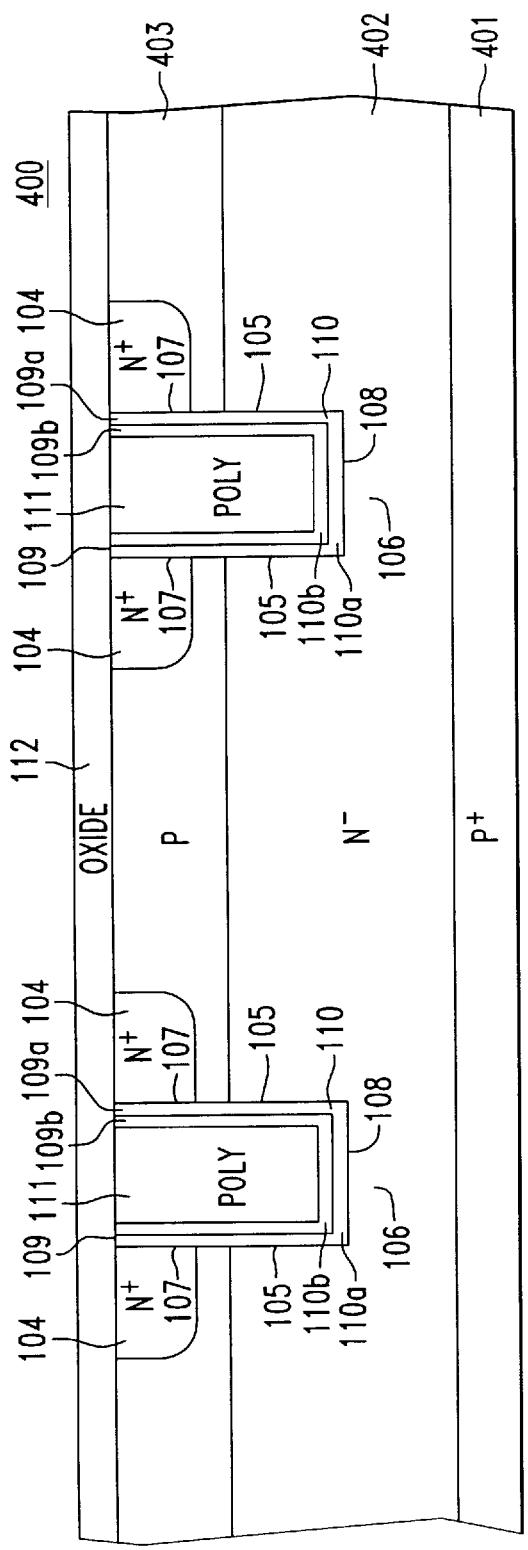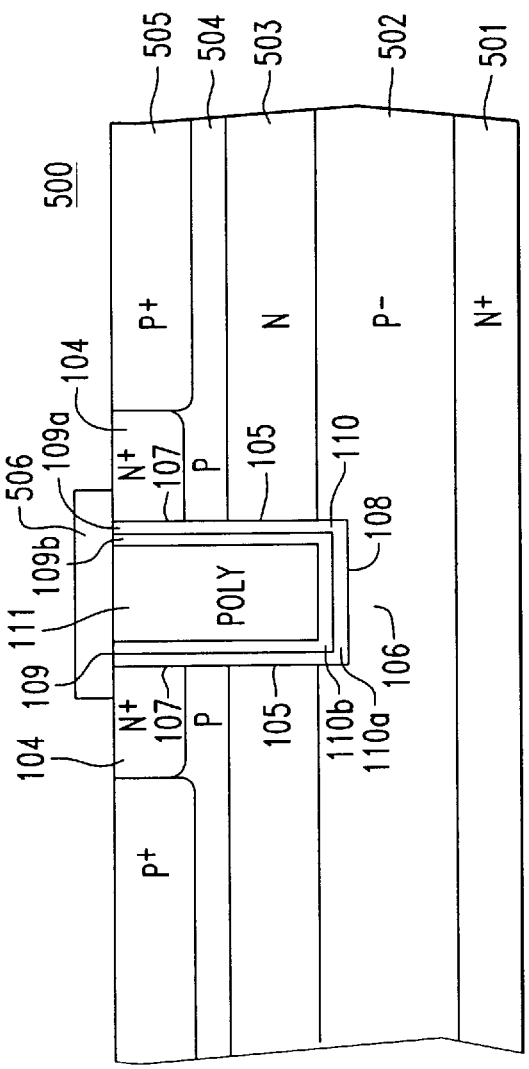

TRENCH MOS GATE DEVICE

This application is a divisional of U.S. patent application Ser. No. 08/636,904, filed Apr. 10, 1996, U.S. Pat. No. 5,770,878.

FIELD OF INVENTION

The present invention relates to MOS devices and, more particularly, to an improved trench MOS gate device and a process for forming same.

BACKGROUND OF THE INVENTION

An MOS transistor that includes a trench gate structure offers important advantages over a planar transistor for high current, low voltage switching applications. In the latter configuration, constriction occurs at high current flows, an effect that places substantial constraints on the design of a transistor intended for operation under such conditions.

A trench gate of a DMOS device typically includes a trench extending from the source to the drain and having sidewalls and a floor that are each lined with a layer of thermally grown silicon dioxide. The lined trench is filled with doped polysilicon. The structure of the trench gate allows less constricted current flow and, consequently, provides lower values of specific on-resistance. Furthermore, the trench gate makes possible a decreased cell pitch in an MOS channel extending along the vertical sidewalls of the trench from the bottom of the source across the body of the transistor to the drain below. Channel density is thereby increased, which reduces the contribution of the channel to on-resistance. The structure and performance of trench DMOS transistors are discussed in Bulucea and Rossen, "Trench DMOS Transistor Technology for High-Current (100 A Range) Switching" in *Solid-State Electronics,* 1991, Vol. 34, No. 5, pg. 493–507, the disclosure of which is incorporated herein by reference. In addition to their utility in DMOS devices, trench gates are also advantageously employed in insulated gate bipolar transistors (IGBTs), MOS-controlled thyristors (MCTs), and other MOS gated device structures.

Trenches lined with oxide dielectric and filled with polysilicon as a means of providing lateral isolation for component islands situated within the trench regions are described in U.S. Pat. Nos. 5,196,373 and 5,248,894, the disclosures of which are incorporated herein by reference. A preferred method of forming the dielectric for this purpose is conventional thermal oxidation.

Thermal oxidation to produce silicon dioxide for isolation of component islands does not require the control of oxide layer thickness provided by the device and process of the present invention. The dielectric used for isolation is very thick, often thicker than 10,000 angstroms. In this thickness range, the oxide grows according to a parabolic growth rule that produces the same growth rate on all crystal surfaces rather than by the orientation dependent linear growth rate that applies to the hundreds of angstroms thickness range relevant for gate oxides. Consequently, thermally grown oxides for isolation purposes have essentially the same thickness on all surfaces.

To minimize oxidation induced stress, a thin, approximately 100-angstrom thick thermal oxide layer is sometimes grown to cover an island surface. This thin oxide layer is then covered with a thick deposited oxide layer of about 10,000 angstroms to provide the required isolation. In such instances, the isolation layer consists almost entirely of deposited oxide. This layer must be thick enough to ensure that average capacitance is low and that the oxide rupture voltage is higher than the maximum voltage to be isolated. However, there are no minimum thickness or uniformity constraints for oxide layers intended for isolation of component islands.

Although the trench gate structure is beneficial for the operation of a transistor at higher currents, its performance can be degraded by the formation of a gate-to-drain capacitance across the dielectric material in the bottom of the trench. Furthermore, the bottom corners of the trench can cause concentration of an electric field when the DMOS is reverse biased, resulting in reduced breakdown voltage. These effects can be mitigated by beneficially controlling the formation of the dielectric layers on the sidewalls and floor of the gate trench, which is provided by the present invention.

SUMMARY OF THE INVENTION

The present invention is directed to an improved trench MOS gate device that comprises a trench whose floor and sidewalls include layers of dielectric material, the layers each having a controlled thickness dimension. These thickness dimensions are related by a controlled floor:sidewall layer thickness ratio, which is established by individually controlling the thickness of each of the floor and sidewall dielectric layers. This floor to sidewall layer thickness ratio is preferably at least 1 to 1, more preferably at least 1.2 to 1.

Further in accordance with the present invention, a process for forming an improved trench MOS gate device comprises etching a trench in a silicon device wafer and forming layers of dielectric material on the trench floor and on the sidewalls, each layer having a controlled thickness dimension. The thickness dimensions are related by a controlled floor to sidewall layer thickness ratio that is preferably at least 1 to 1. When silicon dioxide is employed as the dielectric material, the layers preferably comprise a composite of thermally grown and deposited silicon dioxide.

The trench containing the dielectric layers is filled with polysilicon, and an insulator layer is formed over the polysilicon, thereby forming a trench gate. A patterned electrically conducting metallic interconnect is formed over the trench gate.

The improved trench MOS gate device of the present invention includes a trench gate having a trench provided with layers of dielectric material of an advantageously controlled thickness ratio on the floor and the sidewalls, which reduces the damage caused by undesirable parasitic effects.

BRIEF DESCRIPTION OF THE DRAWINGS

FIG. 2 schematically depicts a process embodiment of the invention.

FIG. 4 schematically represents a trench gate structure of an IGBT of the invention.

FIG. 5 schematically depicts a trench gate structure for an MCT of the invention.

DETAILED DESCRIPTION OF THE INVENTION

Figure 1:
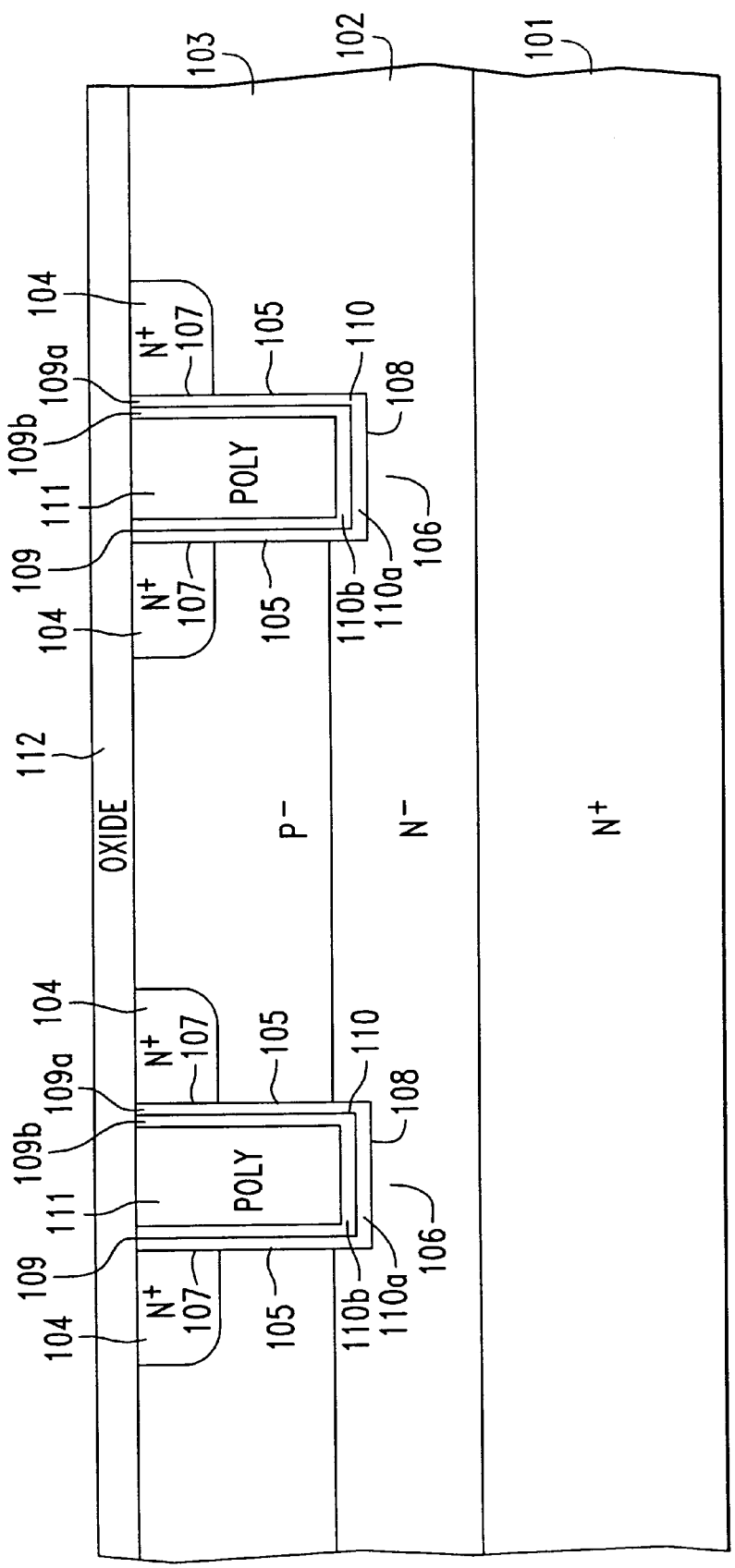
FIG. 1 is a schematic representation of a trench gate structure of a DMOS transistor of the present invention.

The previously described effects that degrade the performance of a trench DMOS transistor can be diminished by increasing the thickness of the silicon dioxide layer on the floor of the gate trench. However, there is a design conflict between the requirements for thick floor oxide to reduce parasitic effects and for thin oxide on the sidewalls of the trench to reduce channel resistance. This conflict is compounded when the conventional thermal oxidation process is used to form channel oxide on silicon substrate having the usual (100) crystal orientation. The thermal oxide grows relatively slowly on the (100) surface on the trench floor and more rapidly on other surfaces such as the (110) surfaces that form the trench sidewalls. As a result, the thermally grown oxide is thicker on the sidewalls than on the floor of the trench. Thus, for example, if a 500-angstrom thick layer of oxide were grown thermally on (110) trench sidewalls, the thickness of the simultaneously grown trench floor oxide layer would be only 355 angstroms because of the slower growth rate on the (100) surface.

If there are multiple crystal orientations for the sidewalls, as can occur when the common hexagon geometry is used for the trench pattern, thermally grown oxide will form layers of different thicknesses on sidewalls having different crystalline orientations. Channel resistance will be higher for the channel segments with thicker oxide, resulting in nonuniform current distribution among the channel segments. This is another undesirable effect of the crystal orientation-dependent growth rate of the gate oxide.

The problems described above can be substantially diminished by using, in accordance with a preferred embodiment of the present invention, a composite oxide forming process for the trench gate. A first portion of the gate oxide is formed by thermal oxidation to achieve a low interface state density. The rest of the gate oxide is formed by chemical vapor deposition, which has a higher deposition rate on horizontal surfaces (such as the trench floor) than it does on vertical surfaces (such as the sidewalls). The faster deposition rate on horizontal surfaces compensates for the slower thermal oxide growth rate on those surfaces so that the composite oxide layer can be thicker on the floor than on the sidewalls.

A system useful for depositing gate oxide in accordance with the present invention employs a Novellus Concept 1 dielectric deposition apparatus, available from Novellus Corp. Such systems can deposit oxide by plasma CVD at a deposition rate ratio of about 2 to 1 on horizontal versus vertical surfaces. A ratio of greater than 1.5 to 1 is preferred.

Thus, for example, a composite oxide having a sidewall total layer thickness of 500 angstroms may be formed on (110) trench sidewalls and (100) trench bottoms as follows: a 250-angstrom thermal oxide layer is grown on the trench sidewalls, along with a simultaneously grown 177-angstrom layer on the trench floor. A 250-angstrom layer of oxide is deposited on the sidewalls over the grown oxide, while a 500 angstrom-thick oxide layer is simultaneously deposited on the floor of the trench. The result of this composite gate oxide formation process is a 500-angstrom thick sidewall oxide layer and a 677-angstrom thick floor oxide layer. This produces the desirable result of thicker floor oxide to suppress parasitic features together with thinner sidewall oxide to minimize channel resistance, a result opposite to that obtained with a conventional dielectric-forming growth process, in which the sidewall oxide is thicker than the floor oxide.

The ratio of floor to sidewall oxide layer thicknesses can be adjusted over a wide range by adjusting the ratio of the thickness of the thermal to the deposited oxide. Using the process of the invention, the performance of a device can be optimized to a degree not possible using the conventional thermal oxidation process.

FIG. 1 schematically depicts a trench gate structure 100 for a DMOS transistor, in accordance with the present invention. Substrate 101 is an $N^+$ silicon wafer on which is grown an $N^-$ layer that provides a drain region 102. A $P^-$ body region 103 is formed by doping, and $N^+$ source regions 104 are formed in the body region 103 by masked ion implant. The difference between the body region 103 and the source region 104 diffusions defines the length of the channels 105.

Trenches 106 formed by patterned etching extend through portions of source regions 104 and body region 103 into drain region 102. Trenches 106 have sidewalls 107 and a floor 108. Sidewalls 107 and floor 108 each include layers 109 and 110, respectively, of silicon dioxide. Preferably, the thickness of floor layer 110 is greater than that of sidewall layers 109. More preferably, layers 109 and 110 comprise a composite of thermally grown layers 109a and 110a, respectively, and deposited layer 109b and 110b, respectively, of silicon oxide. Trenches 106 further contain highly doped polysilicon 111. An insulator layer 112 is formed over the polysilicon 111, which forms a gate between the source regions 104 and the drain region 102. The DMOS transistor of the invention is obtained from the trench gate structure 100 by forming contact apertures, interconnect metal, and a patterned dielectric protection layer over the metal, all not shown in FIG. 1.

In a preferred embodiment, the composite oxide contained in layers 109 and 110 comprises thermally grown silicon dioxide, produced by the reaction of silicon in an oxygen atmosphere, and deposited silicon dioxide, obtained by deposition of the reaction product of a volatile silicon-containing compound. Also in a preferred embodiment, the thickness of the floor layer 110, which may be in the range of about 300 to 3,000 angstroms, is greater than that of the sidewall layers 109, which may be in the range of 200 to 1,500 angstroms.

For low-voltage applications, it is desirable that the perimeter area ratio of the individual small transistors within a switching device be maximized in order to achieve minimum specific on-resistance. An important factor in attaining this objective is the gate topology of the device, as discussed in the previously mentioned paper of Bulucea and Rossen. The trench 106 included in a transistor of the present invention may have an open-cell stripe topology or, preferably, a closed-cell cellular topology. Furthermore, the cellular topology of the trench 106 may have a square or, more preferably, a hexagonal configuration.

An exemplary process sequence useful to make a trench gate device for a DMOS transistor in accordance with the present invention is illustrated in FIGS. 2A–G, which are not to scale.

The process begins with a silicon wafer 200 having an $N^+$ layer 201 of (100) crystal orientation. An $N^-$ silicon layer that provides a drain region 202 is grown on layer 201 using conventional epitaxial growth methods (FIG. 2A). The thickness and resistivity of the layer 202 are chosen to support the desired breakdown voltage while minimizing the on-resistance.

$P^+$ body contacts 203 are optionally formed by masked ion implant and diffusion into selected areas of the wafer surface to act as low resistance body contacts (FIG. 2B). The body contacts 203 may optionally be formed later in the process or omitted.

A $P^-$ body region 204 that overlaps the $P^+$ body contacts 203 is formed (FIG. 2C). The doping profile of the body region 204 is chosen such that the desired threshold voltage will be obtained after the source and trench gates have been formed in the body. The depth of the body junction depth is conveniently about 2 microns.

N+ source regions 205 are formed in the body region 204 by masked ion implant such that they abut the body contacts 203 (FIG. 2D). The depth of the source region 205 is conveniently about 1 micron and is chosen to give the desired channel length. The channel length, which is the difference between the depths of the body and source diffusions, is about 1 micron.

The trench pattern is formed in a suitable mask, and a trench 206 is etched through the exposed portions of source regions 205 and body region 204 into the underlying drain region 202 by reactive ion etching (RIE) (FIG. 2E).

The composite gate oxide is formed from thermally grown and deposited oxide on the exposed sidewalls and bottom of the trench, providing sidewall oxide layers 207 comprising grown and deposited oxide layers 207a and 207b, respectively and bottom oxide layer 208 comprising grown and deposited oxide layers 208a and 208b, respectively. Preferably, this is carried out as previously described in this disclosure. After gate oxide formation, the remainder of the trench 206 is filled with polysilicon 209, and the polysilicon 209 is planarized by, for example, chemical-mechanical planarization (FIG. 2F).

The device fabrication is completed by forming an oxide insulator 210 over the gate polysilicon 209; forming contact apertures through the insulator to source, body contacts, and gate regions (not shown); applying a patterned electrically conducting metallic interconnect 211; and applying a dielectric protection layer 212 over the interconnect 211 (FIG. 2G).

Drain body junction breakdown maximization structures, which are not shown because they do not appear in the interior cellular part of the device, may be formed around the perimeter of the device using known methods.

The thermally grown portion of the composite gate oxide may, for example, be grown in $O_2$ at 900° C. to a thickness of 175 angstroms on (100) crystal surfaces. A chlorine containing compound such as HCl may be included in the oxidizing atmosphere to remove metallic impurities, as is known in the art.

The deposited portion of the composite oxide may be formed using a Novellus plasma CVD deposition system to a thickness, for example, of 500 angstroms on horizontal surfaces. $O_2$ and tetraethoxysilane (TEOS) source gases may be employed at a deposition temperature of about 400° C. The deposited oxide may be densified after deposition by annealing it in a diffusion furnace at 950° C. in a nitrogen atmosphere that optionally contains a small oxygen concentration.

Figure 3A:
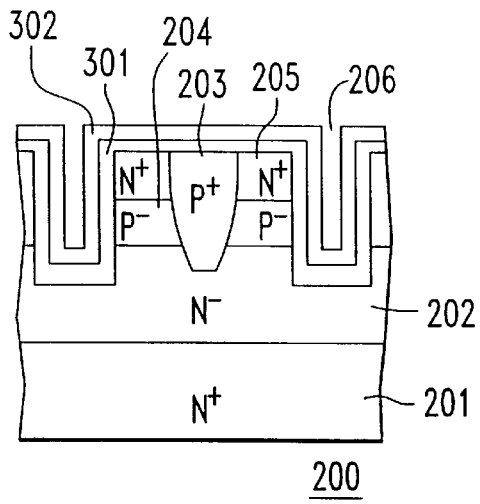
FIG. 3 is a schematic representation of a further process embodiment of the invention.
Figure 3B:
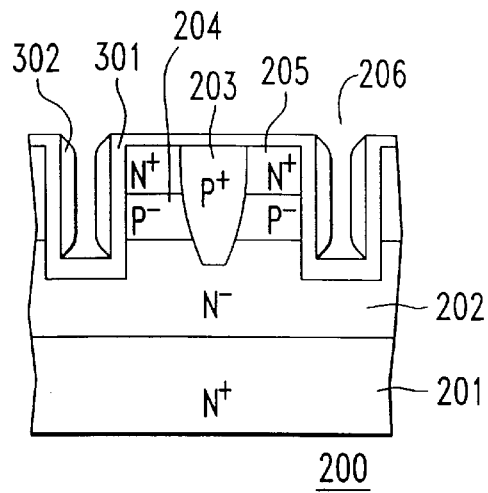
Figure 3C:
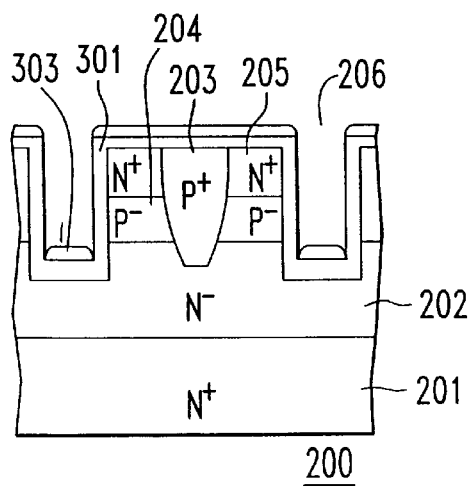

Another embodiment of the process of the invention that produces a thicker layer of oxide on the bottom than on the sidewalls in a trench gate structure is illustrated in FIGS. 3A–C, which are not to scale. The process is the same through the trench etch step as in the previously depicted process (FIGS. 2A–E).

After trench etch, a first gate oxide layer 301 covering all surfaces, both horizontal and vertical, is thermally grown to a sidewall thickness of, for example, 700 angstroms. A silicon nitride layer 302 about 1000 angstroms thick is deposited over the oxide layer 301 by LPCVD (FIG. 3A).

The portions of the nitride layer 302 in the bottoms of the trenches and also on the wafer top surface is removed by a nonmasked anisotropic reactive ion etch (FIG. 3B), which attacks only material on horizontal surfaces. These surfaces are perpendicular to the direction of flight of the etch ions in the etch chamber.

A layer 303 comprising a second portion of gate oxide is then grown to provide a total thickness of, for example, 1000 angstroms on the surfaces not covered by nitride, including the trench bottom. The residual vertical nitride layer 302 protects the trench sidewalls from oxidation in the well known local oxidation process. The residual nitride layer 302 is preferably stripped after the formation of the oxide layer 303. This leaves the trench 206 with a 700-angstrom layer of oxide provided by layer 301 on the sidewalls and a desirably thicker 1000-angstrom layer of oxide provided by layers 301 and 303 together on its bottom (FIG. 3C). The trench 206 is filled with doped polysilicon, and the construction of the transistor is completed as described by FIGS. 2F–G.

The trench gate oxide, which is preferably a composite of thermally grown and deposited oxide, in the device and process of the present invention is sufficiently thin to provide low on-resistance and has constant thickness on all sidewalls to provide equal current flow on the sidewall surfaces. Its interface charge density is low enough to provide low and controlled threshold voltage, and its floor layer thickness is sufficient to minimize capacitance and provide required oxide and junction breakdown.

FIG. 4 is a schematic representation of another embodiment of the present invention, a trench gate structure 400 for an insulated gate bipolar transistor (IGBT). Structure 400 includes a P+ type substrate 401, an N− typed epitaxial layer 402, and body 403. The substrate 401 is the anode of the IGBT. The lightly doped layer 402 is a drift layer that supports high voltage when the device is off. The remaining components in structure 400 are as described for structure 100 of FIG. 1. The thickness of oxide layers 109 and 110 on sidewalls 107 and floor 108, respectively, of trenches 106 of structure 400 are advantageously controlled, in accordance with the present invention, as described for structure 100.

FIG. 5 schematically illustrates, as a further embodiment of the present invention, a trench gate structure 500 in a P type MOS controlled thyristor (MCT). This structure includes an N+ substrate 501, on which is grown a P− epitaxial layer 502. Structure 500 further comprises N type drift region 503, a P type body 504, and a P+ anode region 505. Substrate 501 provides the cathode region. Analogous gate structures useful for N type MCTs can also be constructed, in which case the conductivity type of all regions would be opposite to those depicted for structure 500. An insulator layer 506 is formed over polysilicon 111. The other components depicted in structure 500 are as described for structure 100 of FIG. 1. As with the previously described embodiments, the oxide layers 109 and 110 of structure 500 are characterized by a beneficially controlled thickness ratio.

Process sequences analogous to those illustrated in FIGS. 2A–G and 3A–C for a DMOS transistor gate device are employed to form other embodiments of the present invention, wherein the thickness ratio of the trench floor and sidewalls is controlled in accordance with the present invention.

The invention has been described in detail for the purpose of illustration, but it is understood that such detail is solely for that purpose, and variations can be made therein by those skilled in the art without departing from the spirit and scope of the invention, which is defined by the following claims.

What is claimed is:

1. A process for forming a trench MOS gate device comprising:

etching a trench in a silicon device wafer, said trench having a floor and sidewalls;

forming a first layer consisting essentially of thermally grown silicon dioxide on each of said floor and said sidewalls, said first layer on said floor having a thickness less than the thickness of said first layer on said sidewalls;

forming a second layer consisting essentially of deposited silicon dioxide on said first layer, said second layer on said floor having a thickness greater than the thickness of said second layer on said sidewalls, said first and second layers together forming a silicon dioxide composite layer on each of said floor and said sidewalls, said composite layers having controlled thickness dimensions related by a controlled floor to sidewall thickness ratio of at least 1 to 1, said ratio being obtained by individually controlling the thickness dimensions of each of said thermally grown silicon dioxide and deposited silicon dioxide layers included in each of said floor and sidewall composite layers;

filling said trench containing said composite layers with polysilicon;

applying an insulator over said polysilicon, thereby forming a trench gate; and forming a patterned electrically conducting metallic interconnect on said trench gate.

2. A process according to claim 1 further comprising:

forming a dielectric protection layer over said metallic interconnect.

3. A process according to claim 1, wherein said ratio is at least 1.2 to 1.

4. A process according to claim 1, wherein said floor layer of silicon dioxide has a thickness of 300 to 3,000 angstroms.

5. A process according to claim 1, wherein said sidewall layers of silicon dioxide have a thickness of 200 to 1,500 angstroms.

6. A process according to claim 1, wherein said thermally grown silicon dioxide comprises the product of reaction of silicon in an oxygen-containing atmosphere.

7. A process according to claim 6, wherein said reaction is carried out at a temperature of 700° to 1050° C.

8. A process according to claim 1, wherein said deposited silicon dioxide comprises the reaction product of a volatile silicon-containing compound deposited by chemical vapor deposition.

9. A process according to claim 8, wherein said silicon-containing compound is a silane compound.

10. A process according to claim 9, wherein said silicon compound is tetraethoxysilane.

11. A process according to claim 8, wherein said chemical vapor deposition is carried out at a temperature of 300° to 800° C.

12. A process according to claim 8, wherein said chemical vapor deposition forms silicon dioxide on said floor at a deposition rate faster than the deposition rate on said sidewalls.

13. A process according to claim 12, wherein the deposition rate on said floor is at least about 1.5 times faster than the deposition rate on said sidewalls.

14. A process according to claim 1, further comprising:

annealing said deposited silicon dioxide.

15. A process according to claim 1 wherein the trench MOS gate device comprises a DMOS transistor.

16. A process according to claim 1 wherein the trench MOS gate device comprises an insulated gate bipolar transistor.

17. A process according to claim 1 wherein the trench MOS gate device comprises an MOS-controlled thyristor.

18. A process according to claim 1, wherein said ratio is about 1.35 to 1.

* * * * *